United States Patent
Ichiki et al.

(10) Patent No.: US 8,644,897 B2
(45) Date of Patent: Feb. 4, 2014

(54) JOINT OF SUPERCONDUCTING WIRES AND METHOD FOR JOINING SUPERCONDUCTING WIRES

(75) Inventors: Yota Ichiki, Hitachinaka (JP); Tsuyoshi Wakuda, Hitachinaka (JP); Kazuhide Tanaka, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 106 days.

(21) Appl. No.: 13/282,496

(22) Filed: Oct. 27, 2011

(65) Prior Publication Data
US 2012/0108435 A1 May 3, 2012

(30) Foreign Application Priority Data
Oct. 28, 2010 (JP) ................ 2010-241617

(51) Int. Cl.
*H01L 39/24* (2006.01)
(52) U.S. Cl.
USPC .......................................... 505/220
(58) Field of Classification Search
USPC ............................ 505/220, 230, 490
See application file for complete search history.

(56) References Cited

U.S. PATENT DOCUMENTS

| 8,229,528 B2* | 7/2012 | Nardelli et al. | 505/211 |
| 2009/0264297 A1* | 10/2009 | Nardelli | 505/230 |
| 2010/0190649 A1* | 7/2010 | Doll et al. | 505/220 |
| 2010/0216645 A1* | 8/2010 | Tenbrink et al. | 505/230 |

FOREIGN PATENT DOCUMENTS

| JP | 2003-022719 | 1/2003 |
| JP | 2006-174546 | 6/2006 |

OTHER PUBLICATIONS

Weijun Yao et al., IEEE Transactions on Applied Superconductivity, vol. 19, No. 3, Jun. 2009, pp. 2261-2264, A Superconducting Joint Technique for MgB₂ Round Wires.

* cited by examiner

*Primary Examiner* — Colleen Dunn
(74) *Attorney, Agent, or Firm* — Antonelli, Terry, Stout & Kraus, LLP.

(57) ABSTRACT

Provided is a superconducting apparatus, including a joint of superconducting wires having high electric conduction characteristics and a superconducting magnet or the like. The superconducting joint comprises a plurality of superconducting wires and a sinter which integrates the plurality of superconducting wires. Herein, at least any one of the superconducting wires is a $MgB_2$ superconducting wire, the sinter contains $MgB_2$, and the sinter is compressed form the direction different from the direction toward which the superconducting wires protrude. Further, in order to form such a joint, a compression vessel provided with an opening used for introducing raw material powders to construct the sinter and another opening used for inserting the superconducting wires is utilized, and the openings are directed to different directions each other. Accordingly, $MgB_2$ is filled in the sinter at high density, allowing the joint structure to have a good bonding property among particles.

27 Claims, 8 Drawing Sheets

31···Superconducting Joint  32···Superconducting Coil
33···Persistent Current Switch  34···Current Lead
35···Support-Plate  36···Cryostat 31···Superconducting Joint   32···Superconducting Coil 33···Persistent Current Switch   34···Current Lead 35···Support-Plate   36···Cryostat 21···Screw 22···Screwed Hole for Filling and Compressing Powder Compressing Direction 23···Screw Hole for Joining Upper and Lower Parts of Divided Vessel 41···Powder Compact   42···Heat Insulator

JOINT OF SUPERCONDUCTING WIRES AND METHOD FOR JOINING SUPERCONDUCTING WIRES

CROSS REFERENCE TO RELATED APPLICATIONS

This application claims the foreign priority benefit under Title 35, United State Code, 119 (a)-(d) of Japanese Patent Application No. 2010-241617, filed on Oct. 28, 2010 in the Japan Patent Office, the disclosure of which is herein incorporated by reference in its entirety.

BACKGROUND OF THE INVENTION

1. Field of the Invention

The present invention relates to a joint structure of a joint of superconducting wires (or $MgB_2$ wires) using magnesium diboride ($MgB_2$), and a method for joining the $MgB_2$ wires.

2. Description of the Related Art $MgB_2$ is a superconducting material, having a high critical temperature of 39K and giving high stability of magnetic fields when the material is operated in a persistent mode. Here, disclosed are the following methods for joining $MgB_2$ wires together or joining a $MgB_2$ wire to other superconducting wires such as a NbTi wire and a $Nb_3Sn$ wire.

Japanese Laid-Open Patent Publication No. 2006-174546 describes a method for joining $MgB_2$ superconducting wires using superconducting solder. The method for joining superconducting wires using superconducting solder is also used for joining other superconducting wires such as a NbTi wire or the like.

Japanese Laid-Open Patent Publication No. 2003-22719 describes a method for joining $MgB_2$ wires, comprising the steps of: inserting $MgB_2$ wires into a pipe, filling a $MgB_2$ powder thereinto, and compressing the wires and the powder together. Further, a method for mixing a metal having a low melting point is described so as to improve a particle-particle bonding property among $MgB_2$ powder particles.

Further, W. Yao et al. "A Superconducting Joint Technique for $MgB_2$ Round Wires", IEEE Transaction on Applied Superconductivity, Vol. 19, No. 3, (2009), describes a method comprising the steps of: inserting wires containing a mixed powder of Mg and B powders or $MgB_2$ wire into a cylindrical vessel; filling the mixed powder of Mg and B powders into the vessel from one side of the vessel opposite to the other side of inserting the wires; compressing and heating the above mentioned mixed powder to form $MgB_2$, whereby the $MgB_2$ wires are joined together. Herein, a mixed powder of Mg and B powders forming no $MgB_2$ is filled around the $MgB_2$ wires and subsequently heated. This allows a $MgB_2$ sinter having a good particle-particle bonding property to be produced.

If the superconducting solder described in Japanese Laid-Open Patent Publication No. 2006-174546 is used, superconducting solder can not be used at 10K or more, because the critical temperature of the solder is about 9 k. Therefore, when $MgB_2$ wires are to be joined using superconducting solder, the operational condition at the temperature less than 10K is required, thereby to be unable of making use of a high critical temperature (39K) of $MgB_2$.

When a method using a $MgB_2$ powder described in Japanese laid-open Patent Publication No. 2003-22719 is used, the generated $MgB_2$ powder is filled, which causes a poor particle-particle binding property among $MgB_2$ particles. Accordingly, it is difficult to obtain an electric conduction property required for highly improving the performance of superconducting devices. Hereby, the method has a disadvantage that a time-consuming job is required in order to improve the particle-particle bonding property among the $MgB_2$ particles.

A method described in the document: W. Yao et al "A Superconducting Joint Technique for $MgB_2$ Round Wires", IEEE Transaction on Applied Superconductivity, Vol. 19, No. 3, (2009), using a mixed powder of Mg and B powders comprises the steps of: filling the mixed powder into the vessel from the opposite side to the wire insertion side, and compressing the above mentioned mixed powder. This causes a drawback that a place in the vicinity of the compressing part becomes the highest density place, while the density decreases as apart from the compressing part. Therefore, if the compressing part is distant from the end parts of the wires, the powder density of the end parts becomes low. In contrast, if the compressing part is set close to the end parts of the wires, the wires may be bended during the compressing process. Accordingly, it is difficult to highly increase the powder density of the Mg and B powders in the vicinity of the end parts of the wires.

SUMMARY OF THE INVENTION

As mentioned hereinbefore, an object of the present invention is to solve the aforementioned drawbacks and accomplish to joint the $MgB_2$ superconducting wires having characteristics of the high electric conductivity.

A joint of superconducting wires of the present invention comprises a plurality of superconducting wires and a compressed sinter containing $MgB_2$. The compressed sinter is filled among the plurality of superconducting wires, and the compressed sinter is covered by a compression vessel having a plurality of openings.

A method for joining superconducting wires of the present invention comprises the steps of: using a compression vessel having a first opening for inserting the superconducting wires and a second opening used for a compressing process, at least a part of the second opening communicating with the first openings; inserting the plurality of superconductive wires to be joined through the first opening into the compression vessel. Further, the method comprises the steps of: filling a magnesium powder or a magnesium alloy powder, and a boron powder into the compression vessel; and compressing the powders filled through the second opening and the wires inserted in advance as mentioned above.

Accordingly, the above mentioned construction of the present invention allows the improvement of the electric conduction performance of the joint of the superconducting wires to be achieved.

DETAILED DESCRIPTION OF THE PREFERRED EMBODIMENT

Figure 1:
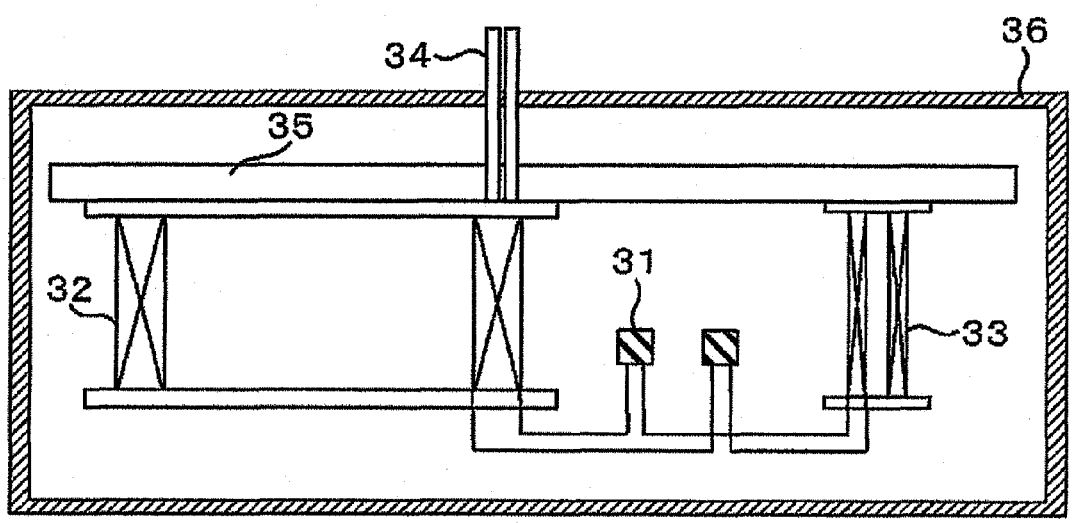
FIG. 1 is a diagram showing a construction of a superconducting magnet.

As mentioned above, the joint structure of the superconducting wires of the present invention is produced by the steps of: inserting a plurality of superconducting wires including Mg and B, or a compound containing Mg and B into a vessel; filing a mixed powder including Mg and B, or the compound containing Mg and B; compressing the resultant inserted and filled mixed powder; and heating the mixed powder to form $MgB_2$ in the joint. Herein, the vessel comprises a hole for compressing the mixed powder that is different from other holes for inserting the superconducting wires, and the directions of the compressing hole and the inserting holes are arranged to be different, thereby to improve physical and electric characteristics of the joint structure.

A superconducting magnet is used for MRI (Magnetic Resonance Imaging) apparatus and NMR (Nuclear Magnetic Resonance) apparatus or the like. Such apparatuses require high stability of a magnetic field. Therefore, the superconducting magnet is comprised of a closed circuit made from only superconducting materials, and is operated in a persistent mode having an electric current continuously flow. For that purpose, is demanded a technology of joining a superconductive coil, a persistent current switch, and wires of connecting the coil and the switch, via the superconducting materials.

According to a conventional superconducting magnet apparatus, a superconducting wire made from NbTi or $Nb_3Sn$ is generally used, and superconducting solder represented by a PbBi alloy is used for joining the superconducting wires. The technology of joining those wires has been established. However, many superconducting magnet apparatuses using the superconducting wire made from NbTi or $Nb_3Sn$, should be cooled at the critical temperature or less of such a wire, whereby the apparatus is cooled by liquid helium at 4.2K.

Characteristics of magnesium diboride ($MgB_2$) are that the material has a high critical temperature for transferring from the normal conduction to the super conduction, and from the super conduction to the normal conduction. The critical temperature of $MgB_2$ is 39K, which is higher than the critical temperatures of conventional metal based materials. In the meantime, although some oxide based materials have high critical temperatures, such materials have a drawback that the stability of the magnetic field is low when operating a superconducting magnet apparatus in the persistent mode.

When a $MgB_2$ wire including magnesium diboride is used as a superconducting wire in a superconducting magnet apparatus, high stability of a magnetic field may be expected. Further, if the apparatus can be operated at 10K or more, no cooling process to the extremely low temperature is needed. Hereby, is expected the practical application as a magnet apparatus to a cooling freezer without using liquid helium.

However, as mentioned above, in order to achieve the closed circuit, the joint of joining a superconducting wire (or $MgB_2$ wire) using magnesium diboride ($MgB_2$) to other $MgB_2$ wires, or other superconducting wires including NbTi or $Nb_3Sn$ or the like, needs to have the $MgB_2$ wire connect with the other wires via $MgB_2$, and further to have high electric conduction characteristics.

The joint structure of the superconducting wires of the present invention is a superconducting joint, comprising a plurality of super conducting wires, and a sinter integrating the plurality of superconducting wires, at least any one of the superconducting wires being a $MgB_2$ superconducting wire including $MgB_2$ as a superconducting material, the sinter including $MgB_2$, and the sinter being compressed in the direction different from the protruding direction of the superconductive wires. That is, the joint structure of the superconducting wires is produced by the processes of: inserting a plurality of wires containing Mg and B or a compound including Mg and B into a compression vessel, filling the mixed powder containing Mg and B or the compound including Mg and B in the vessel thereby to be compressed, having Mg react with B by heating the resultant powder, and finally producing a joint in which $MgB_2$ is formed. Moreover, in order to form such a joint, the compression vessel has holes for inserting the superconducting wires and another hole for compressing the mixed powder. Herein, the inserting holes and the compressing hole are drilled from the different directions respectively. In the present invention, is used the compression vessel having an opening for introducing raw material powders which are used to produce a sinter, and other openings for inserting the superconducting wires; the opening for introducing raw material powders and the other openings for inserting wires being arranged in the different directions. The joint produced by the above mentioned method has a shape in which the sinter is compressed from the different direction against the direction toward which the superconducting wires protrude, the superconducting wires protrude from the openings of the compression vessel into which the superconducting wires are inserted, and no superconducting wires protrude from the opening to which materials to be compressed are inserted. Accordingly, $MgB_2$ is filled in the sinter in a high density, resulting in a joint structure with a good particle bonding property.

Joining of the superconducting wires is conducted by a method comprising the steps of: inserting a plurality of wires containing Mg and B or a compound including Mg and B into a vessel; filling a mixed powder of Mg and B or the compound including Mg and B in the vessel, thereby to be compressed; heating the mixed powder to form $MgB_2$ in the joint; and hereby joining the superconducting wires. In the method, the compression vessel comprises first holes for inserting the superconducting wires together with another second hole for compressing the mixed powder, and the directions of the inserting holes and the compressing hole may be arranged in the different directions (or directions not opposite on the line). Accordingly, spaces in the vicinity of the end parts of the superconducting wires may be compressed, allowing the density of the joint to be highly increased, thereby to improve the electric conduction performance.

Therefore, the mixed powder of Mg and B may be filled in the high density in the joint, and $MgB_2$ having good bonding characteristics between particles thereof is formed by the sintering, allowing the joint structure with a high electric conduction performance to be realized after $MgB_2$ is formed.

Preferably, the compression vessel has a shape in which the holes arranged in the different directions are connected inside the vessel. For example, a method may be considered comprising the steps of: inserting wires into a pipe; filling a mixed powder of Mg and B forming no $MgB_2$ from the opposite direction; and heating the mixed powder together with the wires, in the combination of the techniques described in Japanese Laid-Open Patent Publication Nos. 2006-174546 and 2003-22719. In such a case, it is regarded that a compression vessel having two holes arranged in the same axial direction may be used. However, in that method, when the materials inside the pipe is compressed, the mixed powder may spread in the direction orthogonal to the compressing direction, resulting in difficulty in increasing the powder density of Mg and B in the vicinity of the end parts of the wires.

Here, the superconducting magnet comprising the above mentioned joint structure of the superconducting wires may suppress quenching at the joint of the wires, allowing a stable operation to be performed. FIG. 1 shows a diagram showing a superconducting magnet. The superconducting magnet in FIG. 1 comprises a superconducting coil 32 and a persistent current switch 33 in a cryostat 36, and those units are integrated on a support-plate 35. Superconducting joints 31 are arranged at the two positions between the superconducting coil 32 and the persistent current switch 33.

EXAMPLE

Example 1

At least either of the superconducting wires to be joined was a wire composed of $MgB_2$ and an additive, to show superconducting characteristics, or a wire including a $MgB_2$ raw material powder showing superconducting characteristics by the heating treatment or the like. When such a wire was joined to another wire, a Mg powder or a powder of a Mg containing compound, and a B powder or a powder of a B containing compound were placed around the wires, and the above mentioned materials were compressed and sintered, thereby to form $MgB_2$. The present example may be applied to joining of different types of superconducting wires. For example, the other superconducting wires to be joined may be comprised of a NbTi wire and a $Nb_3Sn$ wire or the like, besides the above mentioned $MgB_2$ superconducting wires. Further, the present example may be applied to a multifilamentary wire including a plurality of superconducting filaments inside the wire as well as a single filamentary wire including one superconducting filament.

As a raw material powder of the wire, preferably, a Mg alloy powder was used. Generally, the formation of $MgB_2$ was performed by a heating treatment at 500° C. or more. However, sometimes $MgB_2$ thus obtained may deteriorate by the repeated heating treatment at 500° C. or more. Accordingly, it is preferable to perform the heating treatment at 500° C. or less. The lower melting point of a Mg alloy than that of simple Mg allows a Mg alloy and boron to react under the condition of 500° C. or less, so as to form $MgB_2$. Therefore, use of a Mg alloy is preferable in order not to deteriorate $MgB_2$ formed in advance. For example, the melting point of $Mg_2Cu$ is about 570° C., allowing $Mg_2Cu$ to react with boron by degree of about 450° C., whereby $MgB_2$ may be obtained.

As a raw material powder of the wire, a $MgB_2$ powder may be added. However, if all amount of the powder is a $MgB_2$ powder, an adhesive property thereof may become low, even though compressing and sintering are performed, resulting in incapability to obtain the desirable electric conductive performance. Therefore, it is needed to use a Mg powder and a B powder, as at least a part of raw materials of a compressed sinter.

The superconducting wire generally comprises a superconductive filament inside the wire and a sheath for protecting the filament. The option whether or not the sheath of the superconducting wire is removed to expose the superconducting filament inside the wire, depends on the situation. When copper or a copper alloy is used as a sheath material of a $MgB_2$ wire, Cu tends to react with magnesium used for a joining process. Hereby, it is preferable to remove the sheath in advance depending on the type of the sheath materials. In contrast, when Fe or stainless-steel is used as a sheath material, those materials are hard to react with Mg, thereby causing little trouble if the compressing and sintering processes are performed with remaining those materials used for the sheath.

As raw material powders of $MgB_2$ for constructing the joint, are used a Mg powder or a powder of a Mg containing compound, and a B powder or a powder of a B containing compound, similarly to the aforementioned $MgB_2$ wire. In such a case, similarly to the $MgB_2$ wire, it is possible to use a Mg alloy or to mix the $MgB_2$ powder as raw materials. Further, a compound containing carbon represented by SiC may be also added, in order to increase the electric conduction characteristics in a high magnetic field.

Figure 2:
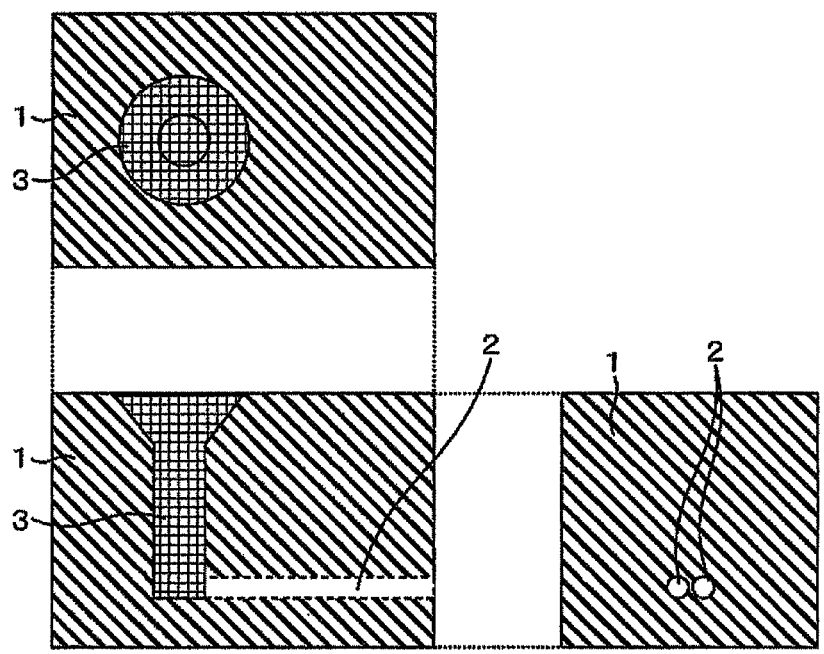
FIG. 2 is a diagram showing an example of a compression vessel used for joining superconducting wires.

FIG. 2 shows cross-sectional diagrams (or front, top and side views) of the vessel used for joining the superconducting wires. The vessel 1 is provided with holes 2 for inserting the superconducting wires, and another hole 3 for filling and compressing the mixed powder. When the directions of the holes 2 and the hole 3 are the same, and the mixed powder is compressed in that state, the wires may be bended, resulting in incapability to increase the powder density in the vicinity of the end parts of the wires. Therefore, as shown in FIG. 2, by having the directions of the holes 2 and the hole 3 orthogonal, the wires are pressed on the bottom surface of the hole 3 when the materials therein are compressed, allowing the powder density in the vicinity of the end parts of the wires to be increased. The angle of the direction of the hole 2 and that of the hole 3 may not be orthogonal. However, preferably the angle may be 60 degrees or more to prevent the wires from being bended.

The vessel 1 in FIG. 2 is provided with two holes 2 for inserting the wires, assuming that two wires are inserted. Preferably, assuming that a gap between the hole 2 and the wire is made as small as possible, so as to prevent the mixed powder from leaking out, when the mixed powder is compressed, and further that the wires become tightly fixed, the holes 2 may be drilled one by one with respect to each wire. Note when the number of the wires increases, hereby, the same number of the holes will be needed. Alternatively, when the wires to be joined may be inserted all together from one opening, a space of the hole may be drilled widely. Further, in FIG. 2, the holes 2 are drilled in the same direction arranged to be in parallel, from the same side of the vessel. The insertion of the wires into the vessel in the same direction allows the space to hardly have an unnecessary gap, the operational performance to be good, and the forming process such as a heating treatment to be facilitated. Note the direction of inserting the wires may be modified, which will be described hereinafter.

Preferably the hole 3 for filling the mixed powder has a taper entrance considering the operational performance during the filling process.

When the MgB$_2$ wire is used, it is preferable to put the mixed powder into the compression vessel after inserting the MgB$_2$ wires. Note the MgB$_2$ wire is fragile. Accordingly, when the mixed powder is put into the compression vessel, then the wires are inserted and the materials in the vessel are compressed from the wire side, the wires tend to be broken. In contrast, first a small amount of the mixed powder may be put into the compression vessel, subsequently the wires may be inserted, and further the mixed powder may be put therein. This procedure allows a compressed sinter to be formed both at the upper and lower sides of the wire, enabling the joint performance to be increased.

A procedure for producing the joint is described as follows. First, the wires are inserted into the vessel 1. The wires thus inserted may be any one of the wires in which no Mg reacts with B, or MgB$_2$ is formed in advance. After the wires are inserted, the mixed powder containing Mg and B powders are filled therein, and the resulting materials are compressed by a member 6 that compresses the above mentioned materials.

Figure 3:
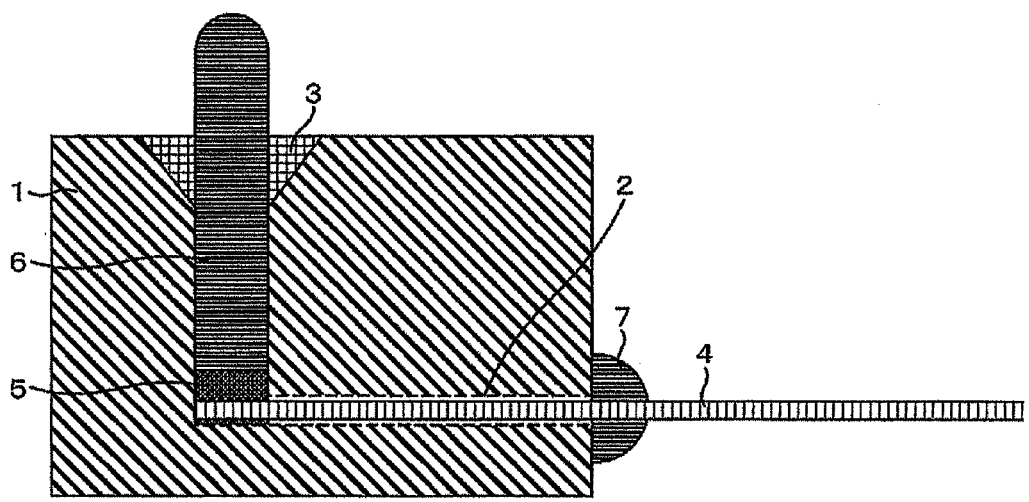
FIG. 3 is a diagram showing an example of a joint of the superconducting wires.
Figure 4:
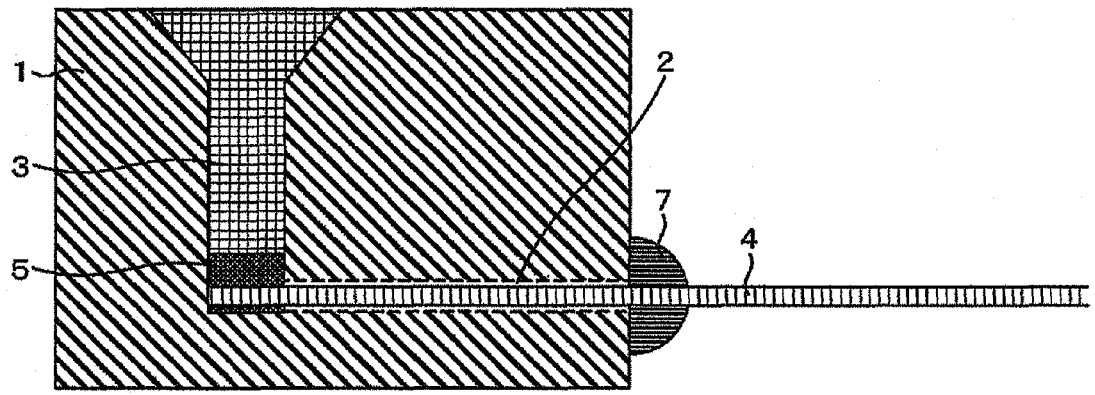
FIG. 4 is a diagram showing an example of the joint of the superconducting wires.

FIG. 3 is a cross-sectional diagram showing the state that the joint is being produced by using the compression vessel as shown in FIG. 2. FIG. 3 is a diagram showing a method for compressing the materials by pushing the member 6 using a press machine. A material of the member 6 may be a hard material, including stainless-steel and iron or the like. After the compression is completed, as shown in FIG. 4, the member 6 used for compressing may be removed. When the member 6 is removed, the member 6 used for compressing may be repeatedly reusable many times.

Figure 5:
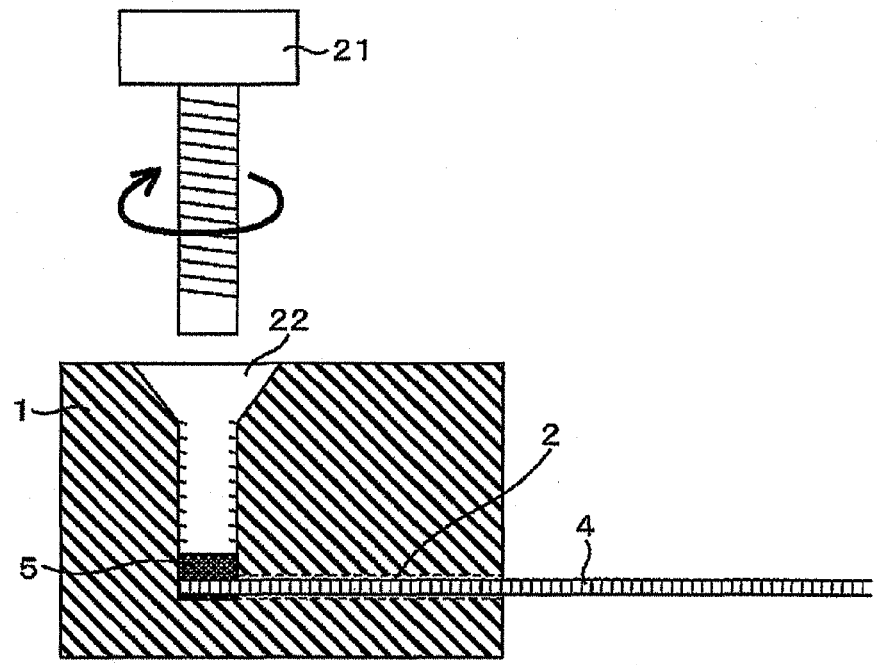
FIG. 5 is a diagram showing an example of the compression vessel which compresses materials by a screw.

FIG. 5 is a diagram showing a method for compressing the materials by a screw, in which a hole 3 and the member 6 are fabricated to have screw threads. That fabrication of making screw threads allows the use of a press machine unnecessary, and facilitates the compressing process.

Figure 6:
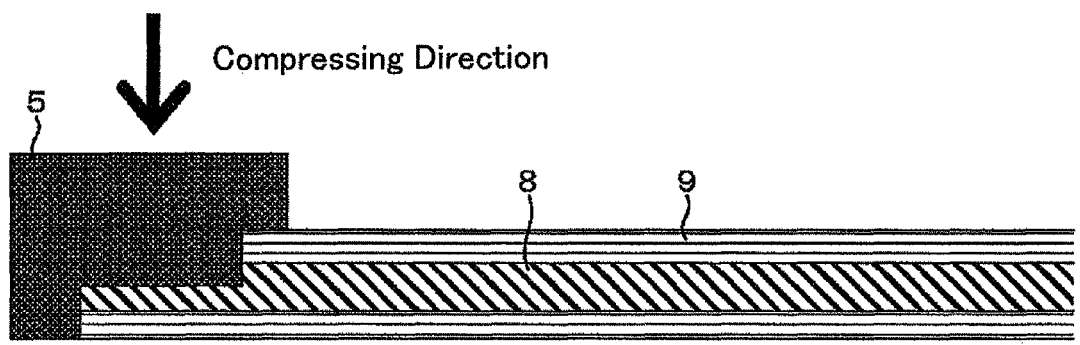
FIG. 6 is a diagram showing an example of a cross-sectional view of an end part of the superconducting wire.
Figure 7:
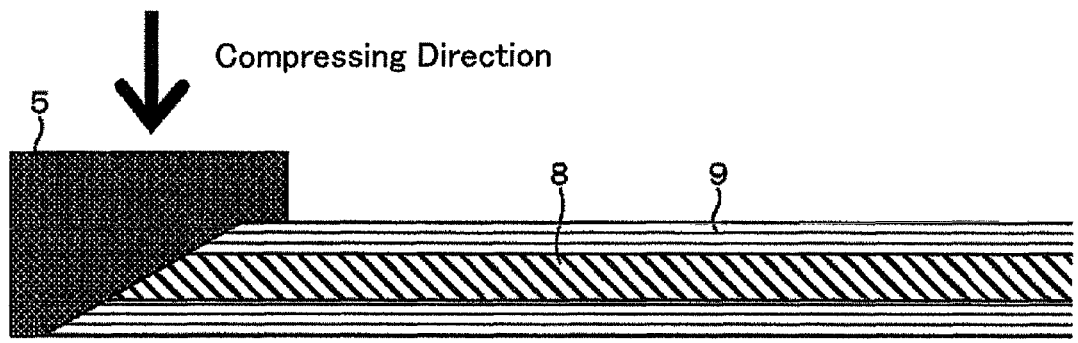
FIG. 7 is a diagram showing an example of a cross-sectional view of an end part of the superconducting wire.

In order to achieve a high electric conductivity, a bonding property between the end parts of the wires and the MgB$_2$ sinter in the joint is important, thereby making it better to enlarge the cross-sectional shape of the end part of the wire. FIGS. 6 and 7 are diagrams showing cross-sectional views in the vicinity of the end part of the wire. FIG. 6 shows a cross-sectional view of a portion of the end part of the wire cut off in parallel in the longitudinal direction. FIG. 7 shows a cross-sectional view of the end part of the wire cut off slantingly. Each structural shape allows the cross-sectional area of the end part of the wire to be wider than that of the end part of the wire cut off in the orthogonal direction against the longitudinal direction, enabling a contact area between a MgB$_2$ portion of the cross-section of the wire and a MgB$_2$ sinter in the joint to be wide. When comparing FIG. 6 and FIG. 7, processing is more easily and faster performed in FIG. 7 than FIG. 6, while the cross-sectional area in FIG. 6 is wider than that in FIG. 7 because a part of the wire is cut off in the longitudinal direction in FIG. 6. However, in both methods, if a part for exposing the cross-section protrudes from the joint, the electric conduction area of the wire decreases, which needs to take care of causing no protrusion. Further, the examples of FIGS. 6 and 7 show a single filamentary wire as an exemplary wire, while a multifilamentary wire may be similarly usable.

Further, as shown in FIGS. 6 and 7, preferably the cross-section of the wire is fixed toward the direction of inserting the compressing member for compressing the mixed powder, thereby to have the compressed mixed powder to be pressed against the cross-section of the wire.

Next, the mixed powder thus compressed is heated to form MgB$_2$. A heating treatment for forming MgB$_2$ is generally performed using an electric furnace in vacuo or in the inert gas such as Ar or N$_2$ at 500 to 800° C. Even if no Mg reacted with B both included in advance in the inserted wire, MgB$_2$ is simultaneously formed as the joint formation. The material of the vessel 1 included Fe, Ni, Nb, Ta or an alloy thereof may be used, in order to prevent the vessel 1 from reacting with Mg or B during the heating treatment. Further, preferably the vessel 1 includes a product made from the above mentioned simple metals or alloys such as stainless-steel or NbTi or the like.

Moreover, the fragile characteristics of MgB$_2$ make it better not to be moved as possible after the heating treatment process. For that reason, it is desirable to fix the vessel 1 and the superconducting wires 4 by a resin or a solder 7. The fixing of the wires and the compression vessel is conducted after the heating treatment. That ordering reason is based on that the high temperature of the heating treatment has a solder and a resin melt down.

In the compressing and heating treatments, a compressed sinter including MgB$_2$ is formed in the joint. Since the joint is formed by the method in the present example, the compressing direction is not identical to the axis direction of the wire. Preferably, the compressed sinter has a flat shape with a wide compressing area. In the compressing direction, the compressed sinter becomes to have a density distribution slope, in which a density of the compressing surface tends to be high, while a density at the deeper portion tends to be low. It is construed that the compressing portion has a high density, the inside portion has a lower density, and the bottom area (or opposite side of the compressing surface) becomes to have a high density. When the compressing area and bottom area are close-by and have a flat shape, the density slope becomes small, allowing the density inside the sinter to be high. Preferably, a thin plate as a sinter is made to have a small cross-sectional area at any cross-sections in the normal line direction against the area of the compressing surface.

Example 2

The present example is a method for producing a joint structure as in Example 1, further improving a volume density of the joint.

A method for increasing a powder density of the joint includes an efficient procedure by suppressing the decrease in volume when MgB$_2$ is formed from the mixed powder of Mg and B. When Mg and B are mixed at the mole ratio of 1:2, the density of the mixture is 1.9 g/cm$^3$, while the density of MgB$_2$ is 2.6 g/cm$^3$. That is, even if a mixed powder of Mg and B is filled in 100% against a volume of a vessel, the total volume of the mixture reduces into about 70% associated with the theoretical density of MgB$_2$, after MgB$_2$ is formed. Herein, formation of MgB$_2$ is caused so that a powder of Mg melts and diffuses to a B powder, whereby MgB$_2$ is produced. At that time, the reduction of the volume results in formation of a vacant space where a solid Mg powder was placed. In fact, if a mixed powder of Mg and B is compressed, since a filling ratio thereof is at most about 80%, the filling ratio of MgB$_2$ after the heating treatment is about 50 to 60%. Herein, three approaches for suppressing the electric conduction characteristics caused by the reduction of the volume of MgB$_2$ may be expected as described below.

The first approach is a method for compressing subjected materials during the heating treatment. That is, after the mixed powder is filled and compressed, the member used for compression 6 is not removed and further a load is continuously added thereto. Accordingly, a gap generated by the reaction between Mg and B may be reduced.

The second approach is a method for adding a MgB$_2$ powder to the mixed powder of Mg and B powders from the beginning. No volume reduction of $MgB_2$ before and after the heating treatment allows the volume reduction when $MgB_2$ is formed, to be moderated by the presence of $MgB_2$ at the beginning. Note the adding rate thereof should be appropriately adjusted because the bonding profile among particles turns to be poor, if the mixing rate of $MgB_2$ at the beginning is too much.

Figure 8:
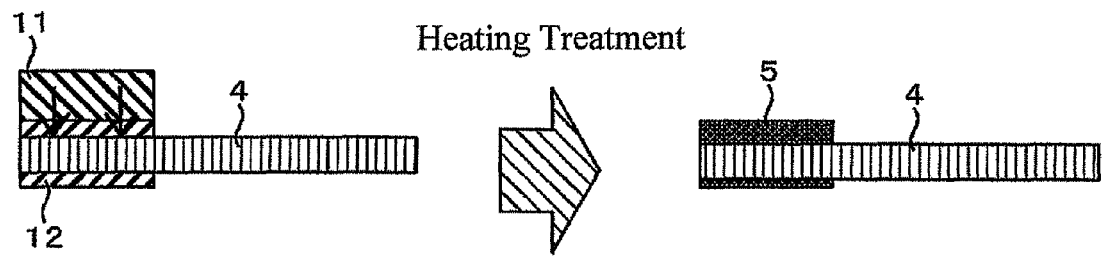
FIG. 8 is a schematic diagram showing a formation of $MgB_2$ by a diffusion method.

The third approach is a method for separately filling a Mg powder and a B powder, thereby dispersing Mg particles into a region where B particles are placed (that is, a formation of $MgB_2$ by the diffusion method). As shown in FIG. 8 (vessel and compressing member not shown), the method comprises the steps of: first inserting the wire 4 into the vessel; filling a B powder 12; compressing the aforementioned materials; and filling a Mg powder 11. The Mg powder melts during the heating treatment so as to diffuse into a compressed B powder 12 filled in advance. Therefore, the form of Mg may be a powder or a lump as long as Mg has a form capable of being filled. Then, the heating treatment melts Mg and diffuses Mg into a region where the filled B powder is compressed, thereby to form $MgB_2$. Accordingly, this method allows a highly dense $MgB_2$ joint with a small vacant space to be formed in the vicinity of the end part of the superconducting wire.

The above mentioned methods for producing the joint enables the density of the compressed sinter of the superconducting wire to be equal to or more than the density (or 70%) of a sinter produced in a usual mixing method.

Example 3

The directions of inserting the wires are not necessarily the same, and may be flexibly modified depending on a direction of wiring in an applied magnet. A procedure of having an insertion direction of each wire different allows the joining wires to fit in the direction of the wiring.

Figure 9:
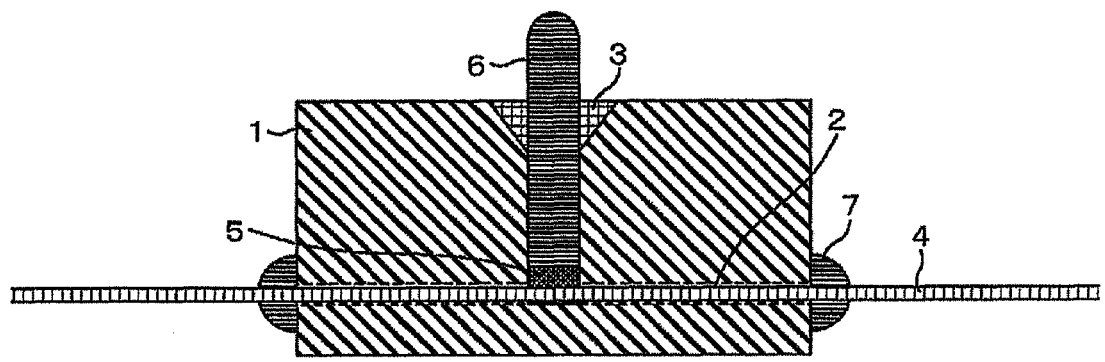
FIG. 9 is a diagram showing a case that insertion directions of the respective wires are different.

FIG. 9 shows an example of a compression vessel provided with two holes 2 for inserting the wires respectively, arranged in the opposite direction. A method for producing a joint comprises the steps of: inserting two wires from left and right sides of the compression vessel; placing the wires opposite at the compressing region in the central part; and integrating the wires using a mixed powder introduced through the hole 3 for compressing, arranged at the upper position.

Figure 10:
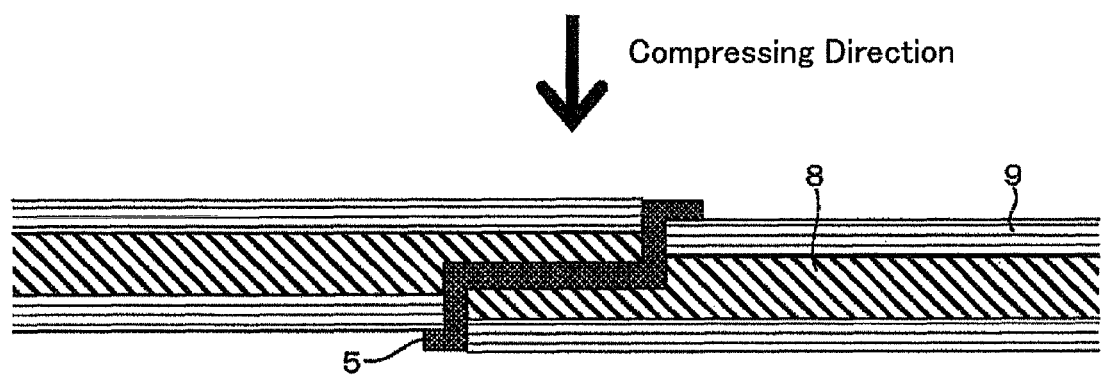
FIG. 10 is a diagram showing an example that the wires are inserted from the opposite directions respectively, and the cross-sections of the wires are put close to each other.
Figure 11:
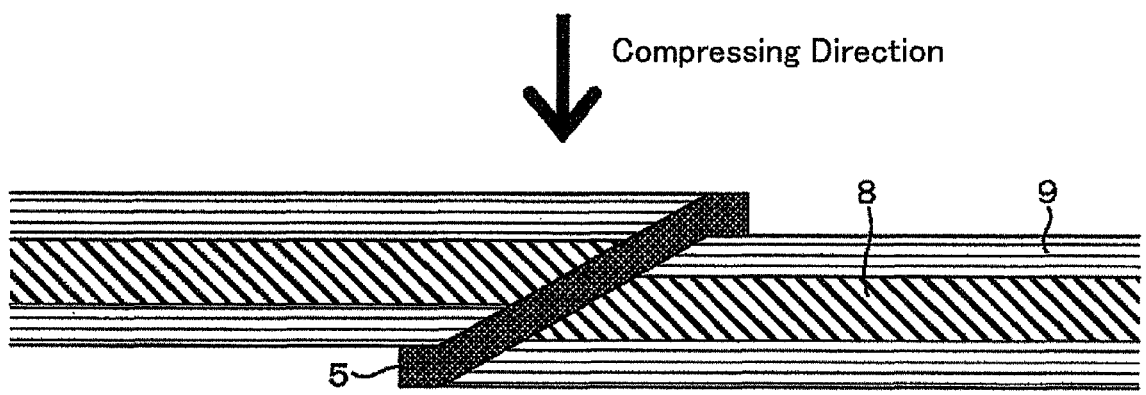
FIG. 11 is a diagram showing an example that the wires are inserted from the opposite directions respectively, and the cross-sections of the wires are put close to each other.

Further, a procedure of having the insertion directions of the wires opposite makes it possible to bring the respective cross-sections of the wires as nearer as possible as shown in FIGS. 10 and 11. By enlarging the cross-sectional areas of the wires and fitting the cross-sectional surfaces each other, the electric conduction characteristics may be improved.

Example 4

The present example is a method for using a detachable compression vessel and removing the compression vessel. In Example 1, the vessel 1 is not always necessary after the heating treatment. If the vessel 1 has a structure capable of disassembling itself after the heating treatment, only $MgB_2$ superconducting wires and $MgB_2$ sinters in the joint may be taken out. This allows the vessel 1 used for compressing and heating treatments to be repeatedly reusable.

Figure 12:
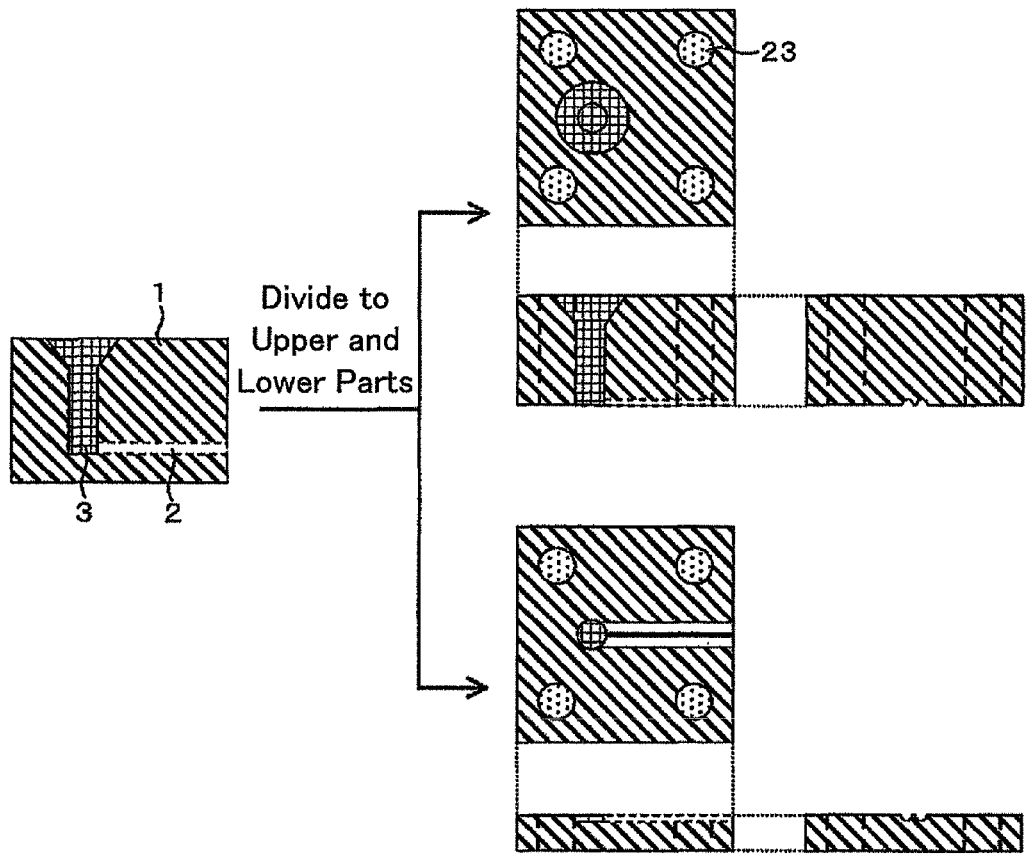
FIG. 12 is a diagram showing an example of a compression vessel which can be disassembled.

FIG. 12 shows a compression vessel capable of being disassembled. In FIG. 12, the vessel comprises two members capable of being divided at the same height as the hole 2 for inserting the wires, thereby to be divided into an upper part and a lower part. Through the screw holes 23 provided with the upper and lower members, the two members are fastened by screws, and then the mixed powder and the wires are compressed and sintered. After compressing and sintering the materials, the vessel is removed to provide only the joint comprising the wires and the compressed sinter. It should be noted when the compression vessel is divided, the vessel may be divided into not only upper and lower members, but also left and right members. Herein, preferably each hole 2 for inserting the wires is divided into two portions at the height where the cross-sectional surfaces of the divided vessels are positioned.

Figure 13:
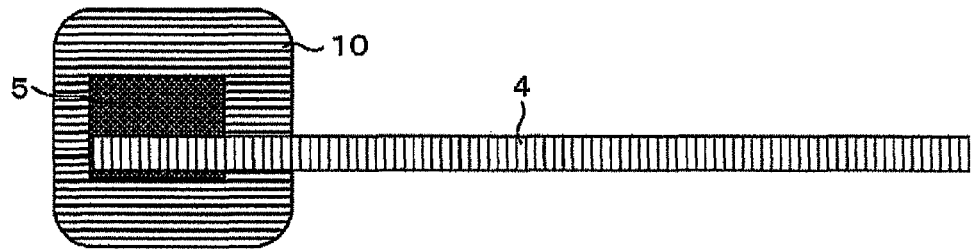
FIG. 13 is a cross-sectional diagram showing a joint structure when the vessel is removed after the heating treatment.

If the vessel is removed, preferably the joint is covered by the member made of a different material from that of the compression vessel. Since the $MgB_2$ sinter is fragile, for the protection thereof, surroundings of the sinter are covered with a protecting member 10 for the $MgB_2$ sinter, including a resin or the like. FIG. 13 shows a cross-sectional diagram of the joint structure covered by the protecting member 10 as mentioned above. The covering of the compressed sinter by a resin or the like enables the compressed sinter to be protected. Further, the covering may prevent the oxidative degradation of $MgB_2$.

Example 5

In the present example, will be explained a procedure comprising of the steps of: using a $MgB_2$ wire in which $MgB_2$ has been already prepared, as at least one of the superconducting wires to be joined; and joining the $MgB_2$ wire to the other superconducting wires. If the wire to be joined is the $MgB_2$ wire in which $MgB_2$ has been already prepared, the reheating treatment conducted to form the joint may cause deterioration of the electric conduction characteristics of the wire. Thus, the following two methods may be expected in order to prevent the deterioration of the electric conduction characteristics of the wire.

The first method comprises a step of using a Mg alloy, which has a lower melting point than Mg, as a raw material powder of the $MgB_2$ sinter in the joint. This allows a formation temperature of $MgB_2$ to be lowered. Here, the melting point of Mg is about 650° C., and simple magnesium reacts with boron at about 500° C. Therefore, when a Mg powder is used for the joint, a heating treatment thereof at 500° C. or more is required. In contrast, the lower melting point of a Mg alloy than simple Mg enables the formation of $MgB_2$ by the heating treatment at 500° C. or less.

The use of an alloy powder with a low melting point may join wires without deteriorating the characteristics of the superconducting wire. The Mg alloy to be used is required to have a lower melting point than Mg, and no reactivity with B during the heating treatment. For example, such an alloy candidate may include a magnesium alloy containing Cu, Ag, Sn, Ga, Pb, In, Bi, and Zn or the like.

A melting point of $Mg_2Cu$ as a Mg—Cu alloy is 570° C., which may have $Mg_2Cu$ react with boron at about 450° C., allowing $MgB_2$ to be obtained. Hereby, this may prevent the degradation of $MgB_2$ already formed.

Next, the second method for preventing the degradation of $MgB_2$ comprises the steps of: selectively heating the filling part of the powder by a microwave; and sintering the powder. Generally, when a usual sintering process is performed, a superconducting wire with a certain degree of length is also heated. Accordingly, deterioration of the wire tends to occur and it needs inevitable time for heating and cooling processes. In contrast, the microwave sintering may locally heat a target powder.

Figure 14:
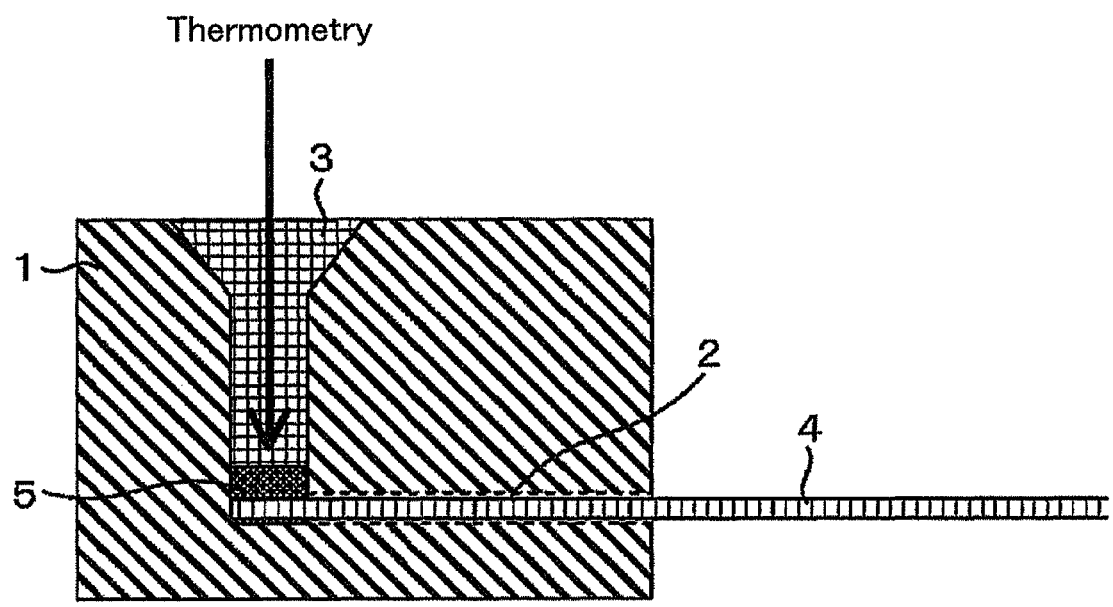
FIG. 14 is a diagram showing an example of a compression vessel for conducting microwave sintering.

FIG. 14 shows a joint structure in the case using the microwave sintering. A thickness of a metallic sheath of the $MgB_2$ wire 4 is generally in the order of 0.1 mm. Hereby, the microwave cannot penetrate the metallic sheath. Therefore, if the vessel 1 is made of a non-conducting material which the microwave can penetrate, only the filling part of the powder may be selectively heated. The local heating treatment of the joint by the microwave allows the increase in temperature of the superconducting wire to be suppressed, thereby to prevent deterioration of the electric conduction characteristics thereof.

A material composing the vessel 1 includes alumina ($Al_2O_3$), silica ($SiO_2$) and magnesia (MgO). Considering that the powder becomes compressed, alumina is preferable in viewpoint of the mechanical strength. As shown in FIG. 14, the inside temperature is detected using a radiation pyrometer through the hole 3 for compressing a powder, thereby to be controlled.

Figure 15:
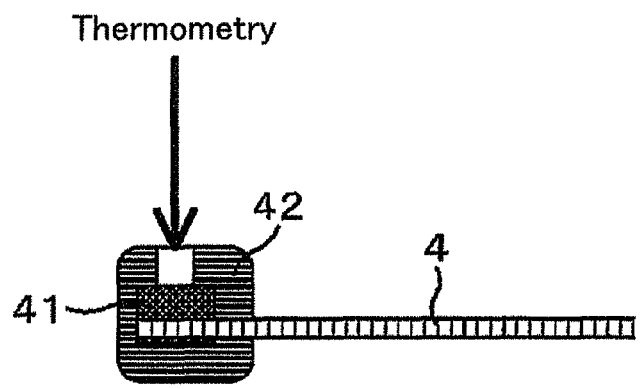
FIG. 15 is a diagram showing an example of a joint to which the microwave sintering is treated after the materials are compressed.

As a method for using no aluminum vessel, as shown in FIG. 12, such a method may be used comprising the steps of: compressing a powder in a metallic vessel which can be divided; taking out a powder compact from the vessel; and microwave sintering the powder compact. At that time, in order to efficiently increase the temperature, preferably a compact 41 is covered by a heat insulator 42 such as alumina fiber as shown in FIG. 15. Note a hole used for the thermometer is needed to be drilled. Further, after the sintering process, preferably the resultant sinter is covered by a resin as shown in FIG. 13.

What is claimed is:

1. A joint of superconducting wires comprising;
a plurality of superconducting wires; and
a compressed sinter containing $MgB_2$ which integrates the superconducting wires, wherein the sinter has a density slope in a direction different from a direction along which longitudinal axes of the superconducting wires extend.

2. The joint of superconducting wires as described in claim 1, wherein at least any one of the superconducting wires contains $MgB_2$.

3. The joint of superconducting wires as described in claim 1, wherein the sinter is covered by a resin.

4. The joint of superconducting wires as described in claim 1, wherein density of the sinter is 70% or more of the theoretical density of $MgB_2$.

5. The joint of superconducting wires as described in claim 1, wherein the sinter contains at least any element selected from Cu, Ag, Sn, Ga, Pb, In, Bi, and Zn.

6. The joint of superconducting wires as described in claim 1, wherein surface areas of end parts of the superconducting wires that are in contact with the sinter are larger than cross-sectional areas of the wires in a direction orthogonal to the longitudinal direction of the wires.

7. The joint of superconducting wires as described in claim 1, wherein
the wires are cut off to have slanting cross-sections, or partially scraped off in a longitudinal direction; and
the cross-sections of the wires are directed to the compressing direction.

8. The joint of superconducting wires as described in claim 6, wherein cross-sections of the plurality of superconducting wires are arranged so as to mutually face each other.

9. The joint of superconducting wires as described in claim 1, wherein
the compressed sinter is covered by a compression vessel; and
the superconducting wires protrude from openings in the compression vessel.

10. The joint of superconducting wires as described in claim 9, wherein the compression vessel has an opening from which no superconducting wires protrude, and the opening from which no superconducting wires protrude has a tapered portion.

11. The joint of superconducting wires as described in claim 9, wherein the compression vessel has an opening from which no superconducting wires protrude, and a compressing member is inserted into the opening from which no superconducting wires protrude.

12. The joint of superconducting wires as described in claim 9, wherein the compression vessel has an opening from which no superconducting wires protrude, and screw machining is performed at an inside surface of a hole with the opening from which no superconducting wires protrude.

13. The joint of superconducting wires as described in claim 9, wherein the plurality of superconducting wires protrude from different openings respectively.

14. The joint of superconducting wires as described in claim 9, wherein the plurality of superconducting wires protrude from openings arranged in an opposite direction.

15. The joint of superconducting wires as described in claim 9, wherein the plurality of superconducting wires protrude from a single opening.

16. The joint of superconducting wires as described in claim 9, wherein the vessel is composed of any one of metals selected from Fe, Ni, Nb, and Ta, or an alloy containing the metal.

17. The joint of superconducting wires as described in claim 9, wherein the vessel is composed of a non-conducting material.

18. The joint of superconducting wires as described in claim 9, wherein the vessel is composed of at least any one member selected from alumina ($Al_2$), silica ($SiO_2$) and magnesia (MgO).

19. The joint of superconducting wires as described in claim 9, wherein the vessel and the superconducting wires are fixed by a resin or a solder.

20. A superconducting magnet comprising a superconducting coil, a persistent current switch, a joint for joining the superconducting coil and the persistent current switch, wherein the joint is the same joint of the superconductive wires as described in claim 1.

21. A method for joining superconducting wires, comprising the steps of:
using a compression vessel provided with at least one first opening for inserting a plurality of superconducting wires and a second opening for introducing raw material powders used for forming $MgB_2$;
introducing the superconducting wires and the raw material powders from the respective openings into the compression vessel;
compressing the powders by inserting a compressing member into the second opening; and
heating the compressed powders, wherein
a longitudinal axis of the at least one first opening and a longitudinal axis of the second opening are arranged in different directions, and compressing the powders provides the powders with a density slope in a direction different from a direction along which longitudinal axes of the superconducting wires extend.

22. The method for joining superconducting wires as described in claim 21, wherein the compression member is removed after completion of compressing.

23. The method for joining superconducting wires as described in claim 21, further comprising the steps of: removing the compression vessel after completion of compressing, and covering a sinter produced after completion of heating the powders with a member made of a material which is different from a material of which the compression vessel is made.

24. The method for joining superconducting wires as described in claim 21, wherein an angle between the longitudinal axis of the at least one first opening and the longitudinal axis of the second opening is 60 degrees or more.

25. The method for joining superconducting wires as described in claim 21, wherein the longitudinal axis of the at least one first opening is orthogonal to the longitudinal axis of the second opening.

26. The joint of superconducting wires as described in claim 1, wherein the sinter has a density slope in a direction inclined at an angle of 60 degrees or more to the direction along which longitudinal axes of the superconducting wires extend.

27. The joint of superconducting wires as described in claim 1, wherein the sinter has a density slope in a direction orthogonal to the direction along which longitudinal axes of the superconducting wires extend.

* * * * *